TUNER MECHANISM FOR TELEVISION AND THE LIKE

Filed Sept. 30, 1969

INVENTOR.
JULIUS KEMENY
BY Francis A. Boss, Jr.
ATTORNEY 3,572,134

TUNER MECHANISM FOR TELEVISION AND THE LIKE

Julius Kemeny, Suffolk, Va., assignor to General Electric Company

Filed Sept. 30, 1969, Ser. No. 862,650
Int. Cl. F16h 35/18
U.S. Cl. 74—10.85 3 Claims

ABSTRACT OF THE DISCLOSURE

A tuner mechanism for television receivers and the like has a tubular channel selector shaft. A threaded fine tuning shaft within the selector shaft reciprocates a fine tuning means concentrically positioned around the selector shaft by means of mechanical interconnections extending through a slot in the channel selector shaft.

BACKGROUND OF THE INVENTION

Numerous mechanisms for fine tuning of radio or television receivers are known in the prior art. But there is always a demand for mechanisms which are simple in construction, easy to assemble, and therefore inexpensive.

STATEMENT OF THE INVENTION

This invention meets the foregoing objective by providing a fine tuning shaft which may be inserted from the knob end into a tubular channel selector shaft, and means interconnecting the fine tuning shaft with a fine tuning means concentrically positioned around the channel selector shaft so that rotation of the fine tuning shaft causes reciprocating movement of the fine tuning means.

DESCRIPTION OF THE PREFERRED EMBODIMENT

Figures 1, 2, 3:
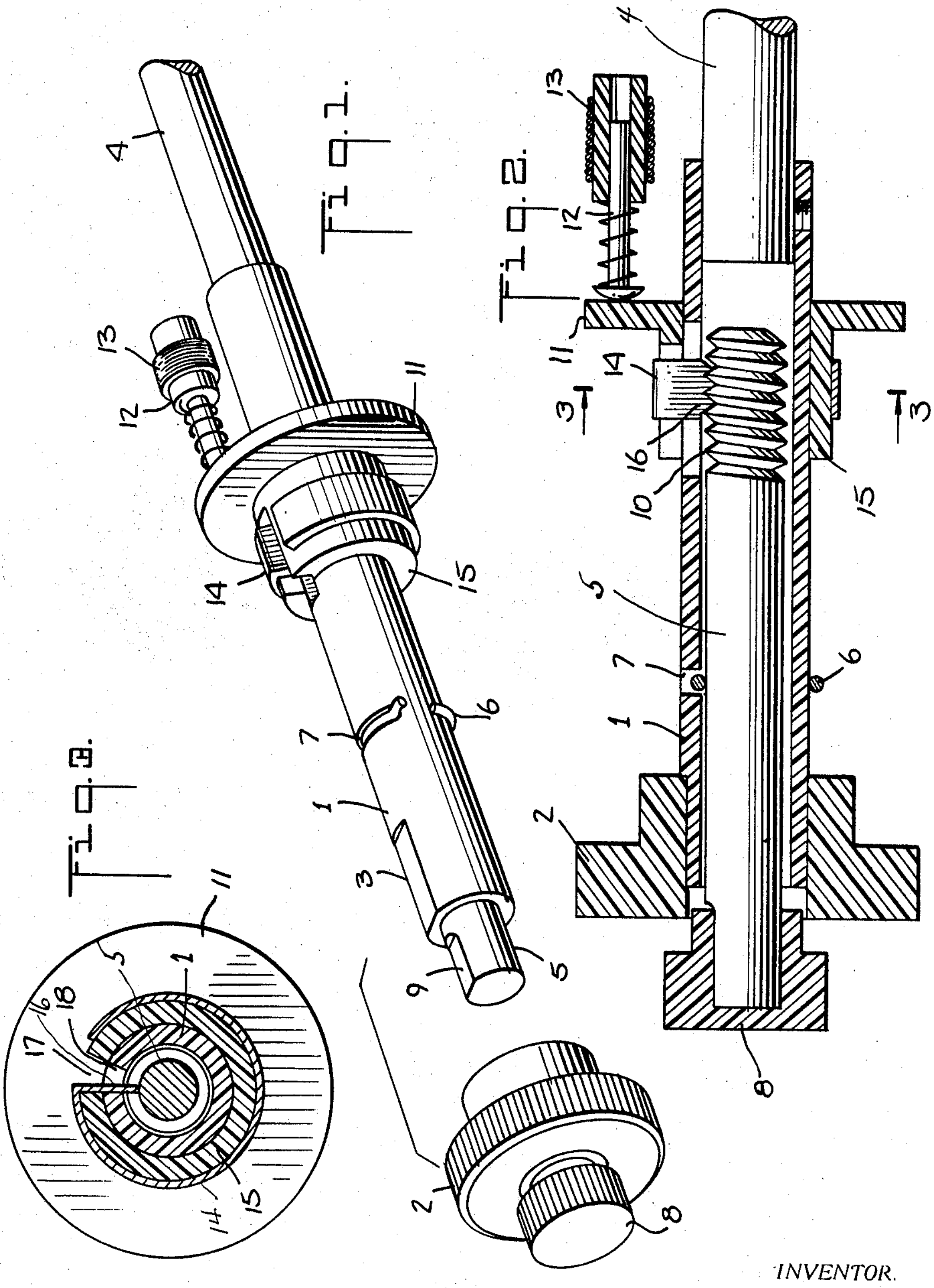
FIG. 1 of the drawing shows in perspective an exploded view of a tuning mechanism in accordance with the invention.
FIG. 2 shows a longitudinal cross section of the mechanism as assembled.
FIG. 3 shows a cross section along line 3—3 of FIG. 2.

A hollow tubular channel selector shaft 1, manually operable by a selector knob 2 which fits over the flattened end 3 of shaft 1, drives a main tuner shaft 4. A fine tuning shaft 5 is inserted concentrically within selector shaft 1 and locked therein by spring ring 6 which extends through slot 7 in selector shaft 1 into engagement with fine tuning shaft 5 (as by a suitable groove in the latter) to restrain relative axial movement between selector shaft 1 and fine tuning shaft 5. A fine tuning knob 8 extends concentrically into selector knob 2 to engage the flattened end 9 of fine tuning shaft 5 for manual rotation thereof. The inner end of fine tuning shaft 5 is provided with threads 10. A fine tuning disc 11 concentrically surrounds selector shaft 1 and is axially slidable thereover so that it may reciprocate a fine tuning plunger 12 movable within a fine tuning coil 13. Reciprocating axial movement of fine tuning disc 11 and fine tuning plunger 12 affixed thereto as fine tuning shaft 5 is rotated by fine tuning knob 8, is accomplished by means of a spring 14 which may be snapped over cylindrical member 15 affixed to fine tuning disc 11. Spring 14 has an end portion 16 which extends through axial slots 17 and 18, respectively in cylindrical member 15 and selector shaft 1, into engagement with threads 10. Spring 14 will firmly engage and hold cylindrical member 15 and the end portion 16, which may be formed with teeth to engage threads 10, will engage fine tuning shaft 5 so that rotation of the threads 10 as fine tuning shaft rotates will move spring 14, cylindrical member 15, and fine tuning disc 11 axially to reciprocate fine tuning plunger 12.

It will be seen that the invention provides a mechanism which is simple in construction, easy to assemble, and inexpensive. Assembly may be accomplished quickly and easily from the knob end by first sliding fine tuning disc 11 with cylindrical member 15 and plunger 12 over selector shaft 1, then inserting fine tuning shaft 5, and then springing spring ring 6 and spring 14 into position. Because selector shaft 1 is outside fine tuning shaft 5, any type of channel indication may be used.

What is claimed is:

1. A tuner mechanism for television and the like comprising:
a tubular channel selector shaft;
a fine tuning shaft within the selector shaft;
fine tuning means concentrically positioned around the channel selector shaft for reciprocating movement axially of the channel selector shaft;
and means interconnecting the fine tuning means and the fine tuning shaft through the channel selector shaft so that rotation of the fine tuning shaft causes such reciprocating movement of the fine tuning means for fine tuning.

2. A mechanism as in claim 1 in which the fine tuning means includes a member slidable over the channel selector shaft, and the last mentioned means comprises threads on the fine tuning shaft, together with a spring engaging the slidable member and the threads on the fine tuning shaft.

3. A mechanism as in claim 2 including a spring extending through a slot in the selector shaft to engage the fine tuning shaft to restrain relative axial movement between the selector shaft and the fine tuning shaft.

References Cited

UNITED STATES PATENTS 3,190,132 6/1965 Lyon, Jr. ............ 74—10.85

MILTON KAUFMAN, Primary Examiner